(12) United States Patent
Nakamura et al.

(10) Patent No.: US 12,077,848 B2
(45) Date of Patent: Sep. 3, 2024

(54) VACUUM PROCESSING APPARATUS

(71) Applicant: Tokyo Electron Limited, Tokyo (JP)

(72) Inventors: Kanto Nakamura, Nirasaki (JP);
Hiroyuki Yokohara, Nirasaki (JP);
Yuki Motomura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/659,018

(22) Filed: Apr. 13, 2022

(65) Prior Publication Data

US 2022/0341028 A1   Oct. 27, 2022

(30) Foreign Application Priority Data

Apr. 21, 2021   (JP) ................... 2021-072077

(51) Int. Cl.
| | |
|---|---|
| H01J 37/34 | (2006.01) |
| C23C 14/34 | (2006.01) |
| C23C 16/44 | (2006.01) |
| H01J 37/32 | (2006.01) |

(52) U.S. Cl.
CPC ...... *C23C 14/3464* (2013.01); *C23C 16/4412* (2013.01); *H01J 37/32449* (2013.01); *H01J 37/32651* (2013.01); *H01J 37/3447* (2013.01)

(58) Field of Classification Search
CPC ............. C23C 14/3464; C23C 14/564; C23C 14/5853; C23C 14/505; C23C 14/0063; C23C 14/0068; C23C 14/0073; C23C 14/081; C23C 14/352; C23C 16/4412; C23C 14/185; H01L 21/67017; H01L 21/6719; H01L 21/68742; H01L 21/68792; H01L 21/67742; H01J 37/32449; H01J 37/32651; H01J 37/3411; H01J 37/3447; H10N 50/01; H01N 50/01
USPC ............. 204/298.07, 298.11, 298.23, 298.26
See application file for complete search history.

(56) References Cited

U.S. PATENT DOCUMENTS

| | | | | |
|---|---|---|---|---|
| 6,051,113 | A | * 4/2000 | Moslehi | ................ C23C 14/568 |
| | | | | 204/192.15 |
| 9,127,353 | B2 | * 9/2015 | Matsumoto | ......... C23C 14/3428 |
| 9,790,590 | B2 | * 10/2017 | Furukawa | ............... C23C 14/08 |
| 2017/0365451 | A1 | * 12/2017 | Yamazaki | ........... H01L 27/1225 |

FOREIGN PATENT DOCUMENTS

| | | | |
|---|---|---|---|
| JP | 2005-350692 | * | 12/2005 |
| JP | 5998654 B2 | | 9/2016 |

OTHER PUBLICATIONS

Machine Translation JP 2005-350692 (Year: 2005).*

* cited by examiner

*Primary Examiner* — Rodney G McDonald
(74) *Attorney, Agent, or Firm* — Armstrong Teasdale LLP

(57) ABSTRACT

A vacuum processing apparatus includes: a stage on which a substrate is placed; and a shutter configured to be able to move between a shielding position at which the stage is covered and a retracted position that is retracted from the shielding position, wherein the shutter arranged at the shielding position forms a processing space between the shutter and the stage, and includes: a gas supplier configured to supply a gas into the processing space; and a gas exhauster provided closer to a center side of the processing space than the gas supplier and configured to exhaust the gas from the processing space.

4 Claims, 9 Drawing Sheets

VACUUM PROCESSING APPARATUS

CROSS-REFERENCE TO RELATED APPLICATION

This application is based upon and claims the benefit of priority from Japanese Patent Application No. 2021-072077, filed on Apr. 21, 2021, the entire contents of which are incorporated herein by reference.

TECHNICAL FIELD

The present disclosure relates to a vacuum processing apparatus.

BACKGROUND

Patent Document 1 discloses a vacuum processing apparatus which forms a metal film on a substrate on a stage inside a vacuum container by sputtering a target arranged so as to face the substrate by ions in plasma obtained by turning a plasma generation gas into plasma, and then oxidizes this metal film. The vacuum processing apparatus includes a shielding member which is movable between a shielding position that covers the substrate and a retracted position that is retracted from the shielding position that covers the substrate, and an oxygen supplier which is movable between an upper position above the substrate and a retracted position that is retracted from the upper position to supply an oxygen-containing gas.

PRIOR ART DOCUMENT

Patent Document

Patent Document 1: Japanese Patent No. 5,998,654

Incidentally, oxygen is highly reactive. Thus, when the oxygen-containing gas is supplied to the substrate from a position far from the substrate, the oxygen-containing gas, before reaching the substrate, reacts with and adsorbs on metal or the like adhering to the inner wall of a chamber or the like, for example when the target is sputtered to form the metal film on the substrate. This makes it difficult to stably supply the gas to the metal film formed on the substrate.

Further, as shown in the vacuum processing apparatus disclosed in Patent Document 1, when the shielding member is moved to the shielding position and the oxygen supplier is moved to the upper position to supply the oxygen-containing gas to the substrate, a difference occurs in pressure between the vicinity of the center of the substrate and the outer edge thereof.

SUMMARY

According to an embodiment of the present disclosure, there is provided a vacuum processing apparatus including: a stage on which a substrate is placed; and a shutter configured to be able to move between a shielding position at which the stage is covered and a retracted position that is retracted from the shielding position, wherein the shutter arranged at the shielding position forms a processing space between the shutter and the stage, and includes: a gas supplier configured to supply a gas into the processing space; and a gas exhauster provided closer to a center side of the processing space than the gas supplier and configured to exhaust the gas from the processing space.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
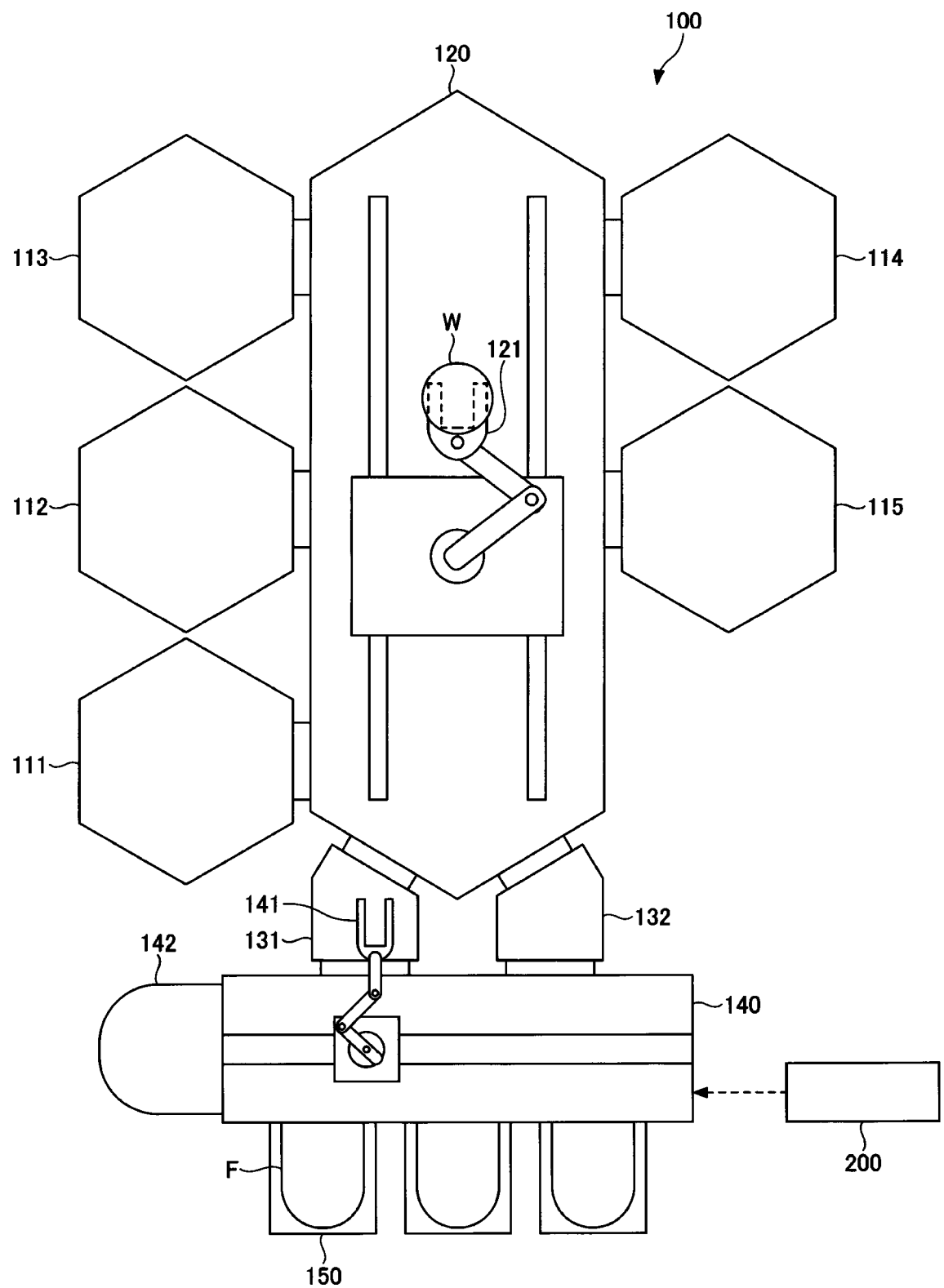
FIG. 1 is a plane view showing a configuration of an example of a substrate processing system.

Hereinafter, embodiments for carrying out the present disclosure will be described with reference to the drawings. Throughout the drawings, the same components may be denoted by the same reference numerals, and thus, a description thereof will be omitted to avoid duplication herein. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Substrate Processing System 100>

An example of an overall configuration of a substrate processing system 100 will be described with reference to FIG. 1. FIG. 1 is a plane view showing the configuration of an example of the substrate processing system 100.

The substrate processing system 100 shown in FIG. 1 is a system having a cluster structure (multi-chamber type). The substrate processing system 100 includes a plurality of process chambers 111 to 115, a vacuum transfer chamber 120, load lock chambers 131 and 132, an atmosphere transfer chamber 140, a load port 150, and a controller 200.

The process chambers (vacuum processing apparatuses) 111 to 115 are depressurized to a predetermined vacuum atmosphere. A desired process (cleaning process, etching process, film forming process, or the like) is performed on a wafer (substrate) W inside each of the process chambers (vacuum processing apparatuses). The process chambers 111 to 115 are arranged adjacent to the vacuum transfer chamber 120. The process chambers 111 to 115 and the vacuum transfer chamber 120 communicate with each other by opening/closing respective gate valves (see gate valves 24 to be described later in FIG. 3). Each of the process chambers 111 to 115 includes a stage on which the wafer W is placed (see a stage 6 to be described later in FIG. 3). The operation of each part for a process in each of the process chambers 111 to 115 is controlled by the controller 200.

The vacuum transfer chamber 120 is connected to a plurality of chambers (the process chambers 111 to 115 and the load lock chambers 131 and 132) via respective gate valves, and is depressurized to a predetermined vacuum atmosphere. Further, a vacuum transfer device 121 for transferring the wafer W is provided inside the vacuum transfer chamber 120. The vacuum transfer device 121 loads/unloads the wafer W between the process chambers 111 to 115 and the vacuum transfer chamber 120 with the opening/closing of the gate valves of the process chambers 111 to 115. Further, the vacuum transfer device 121 loads/unloads the wafer W between the load lock chambers 131 and 132 and the vacuum transfer chamber 120 with the opening/closing of the gate valves of the load lock chambers 131 and 132. The operation of the vacuum transfer device 121 and the opening/closing of the gate valves are controlled by the controller 200.

The load lock chambers 131 and 132 are provided between the vacuum transfer chamber 120 and the atmosphere transfer chamber 140. Each of the load lock chambers 131 and 132 includes a stage (not shown) on which the wafer W is placed. The load lock chambers 131 and 132 is configured to be switched between an air atmosphere and a vacuum atmosphere. The load lock chambers 131 and 132 and the vacuum transfer chamber 120 kept in the vacuum atmosphere communicate with each other by opening/closing the gate valves. The load lock chambers 131 and 132 and the atmosphere transfer chamber 140 kept in the air atmosphere communicate with each other by opening/closing door valves. The switching between the vacuum atmosphere and the air atmosphere inside the load lock chambers 131 and 132 is controlled by the controller 200.

The atmosphere transfer chamber 140 is kept in the air atmosphere. A down flow of clean air is formed inside the atmosphere transfer chamber 140. Further, an atmosphere transfer device 141 for transferring the wafer W is provided inside the atmosphere transfer chamber 140. Further, the atmosphere transfer chamber 140 is provided with an aligner 142 for aligning the wafer W.

Further, the load port 150 is provided on the wall surface of the atmosphere transfer chamber 140. A carrier F in which the wafer W is accommodated or an empty carrier F is attached to the load port 150. As the carrier F, for example, FOUP (Front Opening Unified Pod) or the like may be used.

The atmosphere transfer device 141 loads/unloads the wafer W between the load lock chambers 131 and 132 and the atmosphere transfer chamber 140 with the opening/closing of the door valves. Further, the atmosphere transfer device 141 loads/unloads the wafer W between the aligner 142 and the atmosphere transfer chamber 140. Further, the atmosphere transfer device 141 loads/unloads the wafer W between the carrier F attached to the load port 150 and the atmosphere transfer chamber 140. The operation of the atmosphere transfer device 141 and the opening/closing of the door valves are controlled by the controller 200.

The controller 200 includes a CPU (Central Processing Unit), a ROM (Read Only Memory), a RAM (Random Access Memory), and a HDD (Hard Disk Drive). The controller 200 is not limited to include the HDD but may include other storage areas such as a SSD (Solid State Drive). A recipe in which a process procedure, a process condition, and a transfer condition are set is stored in the storage area such as the HDD or RAM.

The CPU controls the processing of the wafer W in each of the process chambers 111 to 115 according to the recipe, and controls the transfer of the wafer W. The HDD or RAM may store a program for executing the processing of the wafer W and the transfer of the wafer W in each of the process chambers 111 to 115. The program may be stored in a storage medium and provided therefrom, or may be provided from an external device via a network.

Figure 2:
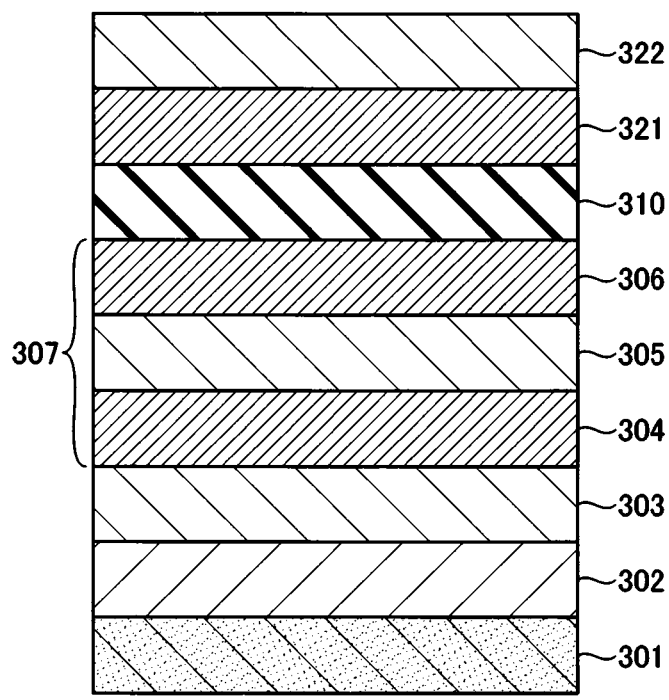
FIG. 2 is an example of a cross-sectional view of an element formed in the substrate processing system.

FIG. 2 is an example of a cross-sectional view of an element formed by the substrate processing system 100 according to the present embodiment. Here, a case in which a perpendicular magnetization type MTJ (Magnetic Tunnel Junction) element (magnetic resistance element) is formed will be described as an example.

A substrate 301 is, for example, a Si substrate. A lower electrode 302 is formed on the substrate 301. A base layer 303 is formed on the lower electrode 302. The base layer 303 is formed by laminating, for example, a Ta film and a Ru film.

A fixed layer 307 having a SAF (Synthetic Antiferromagnet) structure is formed on the base layer 303. The fixed layer 307 includes a first magnetic layer 304, a spacer layer 305, and a second magnetic layer 306.

The first magnetic layer 304 is formed on the base layer 303. The first magnetic layer 304 forms an antiferromagnetic bond with the second magnetic layer 306 via the non-magnetic spacer layer 305, and fixes a magnetization direction of the second magnetic layer 306. The first magnetic layer 304 is formed as, for example, a multilayer film in which Co films and Pt films are alternately laminated one above the other.

The non-magnetic spacer layer 305 is formed on the first magnetic layer 304. The spacer layer 305 is made of, for example, Ru, Rh, Ir, or the like.

The second magnetic layer 306 is formed on the spacer layer 305. The second magnetic layer 306 is formed of, for example, a CoFeB film. Further, the second magnetic layer 306 is formed by laminating, for example, a multilayer film in which Co films and Pt films are alternately laminated one above the other, a Ta film, and a CoFeB film.

A tunnel barrier layer 310 is formed on the second magnetic layer 306. The tunnel barrier layer 310 is formed of a MgO film.

A free layer 321 is formed on the tunnel barrier layer 310. The free layer 321 is formed of, for example, a CoFeB film. As a result, a MTJ element is formed by the CoFeB film of the fixed layer 307 (the second magnetic layer 306), the MgO film of the tunnel barrier layer 310, and the CoFeB film of the free layer 321.

A cap layer 322 is formed on the free layer 321. The cap layer 322 is formed by laminating, for example, a Ta film and a Ru film.

In the substrate processing system 100 shown in FIG. 1, the process chamber 111 is a process chamber for performing a pre-cleaning process (etching process) on the wafer W on which the lower electrode 302 is formed. Further, the process chamber 112 is a process chamber for forming the base layer 303, the first magnetic layer 304, and the spacer layer 305 on the wafer W processed in the process chamber 111. Further, the process chamber 113 is a process chamber for forming the second magnetic layer 306 on the wafer W processed in the process chamber 112. Further, the process chamber 114 is a process chamber for forming the tunnel barrier layer 310. Further, the process chamber 115 is a process chamber for forming the free layer 321 and the cap layer 322.

In the substrate processing system 100 configured as above, the controller 200 controls the atmosphere transfer device 141 and the vacuum transfer device 121 to adjust the position of the wafer W accommodated in the carrier F attached to the load port 150 with the aligner 142 and transfer the wafer W into the process chamber 111 via the load lock chambers 131 and 132. Next, the controller 200 controls the process chamber 111 to perform the pre-cleaning process on the wafer W. Next, the controller 200 controls the vacuum transfer device 121 to transfer the wafer W processed in the process chamber 111 from the process chamber 111 into the process chamber 112. Next, the controller 200 controls the process chamber 112 to form the base layer 303, the first magnetic layer 304, and the spacer layer 305 on the wafer W. Next, the controller 200 controls the vacuum transfer device 121 to transfer the wafer W processed in the process chamber 112 from the process chamber 112 to the process chamber 113. Next, the controller 200 controls the process chamber 113 to form the second magnetic layer 306 on the wafer W.

Next, the controller 200 controls the vacuum transfer device 121 to transfer the wafer W processed in the process chamber 113 from the process chamber 113 to the process chamber 114. The controller 200 controls the process chamber 114 to form the tunnel barrier layer 310 on the wafer W.

Next, the controller 200 controls the vacuum transfer device 121 to transfer the wafer W processed in the process chamber 114 from the process chamber 114 to the process chamber 115. Next, the controller 200 controls the process chamber 115 to form the free layer 321 and the cap layer 322 on the wafer W. As a result, the perpendicular magnetization type MTJ element shown in FIG. 2 is formed on the wafer W. Lastly, the controller 200 controls the vacuum transfer device 121 and the atmosphere transfer device 141 to accommodate the wafer W processed in the process chamber 115, in the carrier F attached to the load port 150 via the load lock chambers 131 and 132.

<Process Chamber 114>

Figure 3:
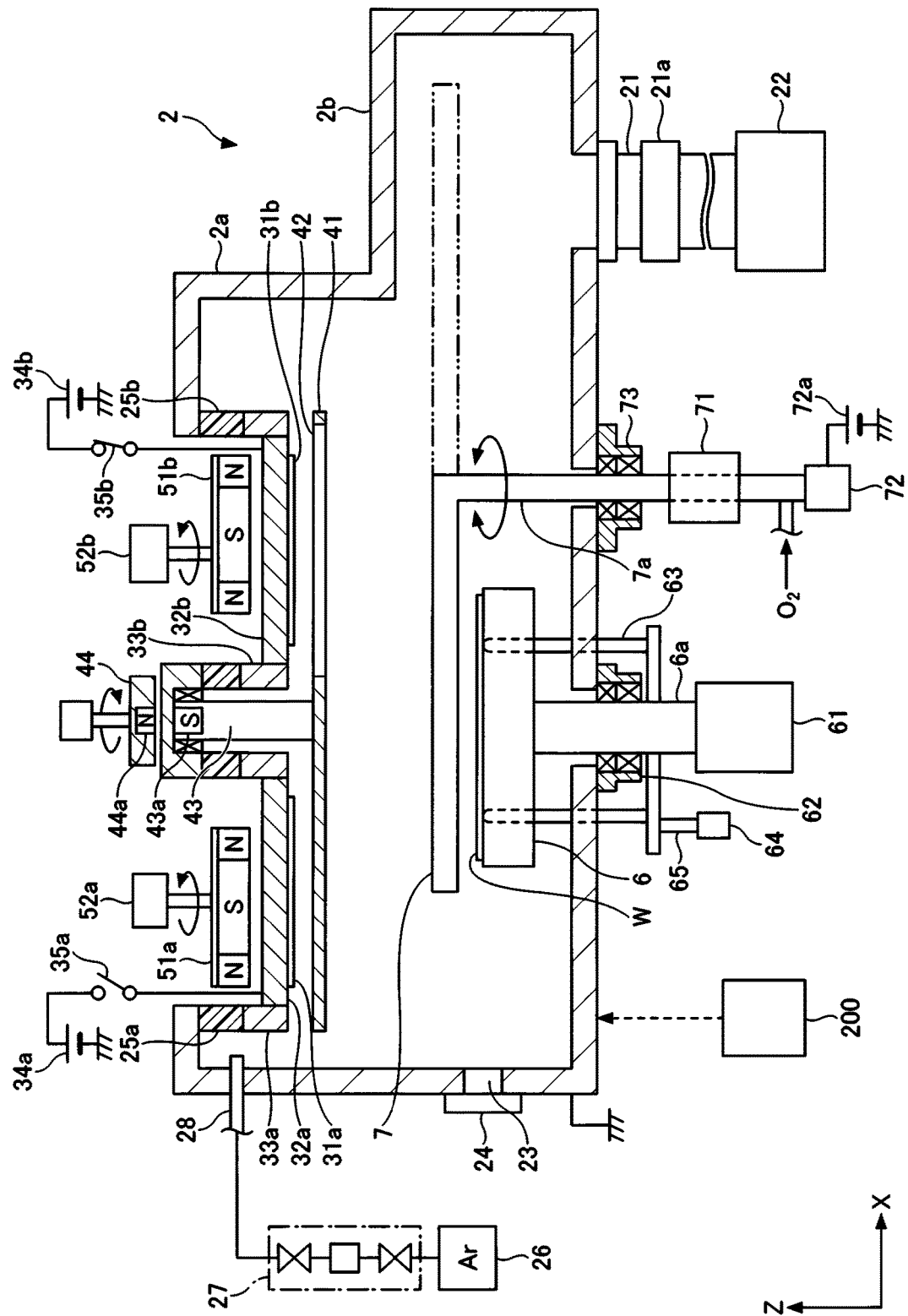
FIG. 3 is an example of a cross-sectional view showing a configuration of a process chamber according to an embodiment.

Next, the process chamber (vacuum processing apparatus) 114 for forming a metal oxide film on the wafer W will be further described with reference to FIG. 3. FIG. 3 is an example of a cross-sectional view showing the configuration of the process chamber (vacuum processing apparatus) 114 according to the present embodiment. Here, the process chamber 114 will be described as forming a MgO film as the tunnel barrier layer 310 on the wafer W.

A vacuum container 2 is formed of a conductive material such as stainless steel and is grounded. The vacuum container 2 includes a cylindrical portion 2a and a protruded portion 2b.

An exhaust path 21 is connected to the bottom of the protruded portion 2b of the vacuum container 2. The exhaust path 21 is connected to a vacuum exhaust device 22 via a pressure regulator 21a. Further, a gate valve 24 for opening/closing a loading/unloading port 23 for the wafer W is provided on the side surface of the cylindrical portion 2a of the vacuum container 2. Further, the process chamber 114 is connected to the vacuum transfer chamber 120 (see FIG. 1) via the gate valve 24.

Target electrodes 32a and 32b are provided on the ceiling of the cylindrical portion 2a of the vacuum container 2. The target electrodes 32a and 32b are formed in a circular shape in a plan view and have substantially the same size. Further, the target electrodes 32a and 32b are provided horizontally side by side (side by side in the X-axis direction).

The target electrode 32a is held by a ring-shaped holding body 33a. The holding body 33a is bonded to the ceiling of the cylindrical portion 2a via a ring-shaped insulator 25a. Similarly, the target electrode 32b is held by a ring-shaped holding body 33b. The holding body 33b is bonded to the ceiling of the cylindrical portion 2a via a ring-shaped insulator 25b. As a result, the target electrodes 32a and 32b are arranged at positions dropped below the upper surface of the cylindrical portion 2a in a state of being electrically insulated from the vacuum container 2.

The target electrode 32a is connected to a power supply 34a via a switch 35a. At the time of execution of sputtering of a target 31a, the power supply 34a applies, for example, a negative DC voltage to the target electrode 32a. Similarly, the target electrode 32b is connected to a power supply 34b via a switch 35b. At the time of execution of sputtering a target 31b, the power supply 34b applies, for example, a negative DC voltage to the target electrode 32b.

The target 31a is bonded to the lower surface of the target electrode 32a. An example of a material of the target 31a includes, for example, a member that absorbs oxygen or moisture (hereinafter, also referred to as a gettering member), and may be, for example, titanium (Ti), chromium (Cr), tantalum (Ta), zirconium (Zr), magnesium (Mg), hafnium (Hf), or an alloy thereof.

The target 31b is bonded to the lower surface of the target electrode 32b. An example of a material of the target 31b may include magnesium (Mg) which is a film forming material of the metal film (the MgO film and the tunnel barrier layer 310) formed on the wafer W.

A shutter 41 is provided directly below the targets 31a and 31b. The shutter 41 is a circular plate having a size that covers projection regions of both the targets 31a and 31b, and is rotatably attached to the center of the upper surface of the cylindrical portion 2a via a rotary shaft 43. A rotation driver 44 having a magnet 44a is provided at a position corresponding to the rotary shaft 43 above the ceiling of the vacuum container 2. The rotary shaft 43 rotates due to a magnetic coupling between the magnet 44a and a magnet 43a provided on the rotary shaft 43 side.

Further, the shutter 41 is formed with one opening 42 having a size slightly larger than the targets 31a and 31b. When the opening 42 of the shutter 41 is positioned in a region facing one target 31a (or 31b), the other target 31b (or 31a) is covered by the shutter 41. This makes it possible to prevent particles generated by sputtering from adhering to the other target 31b (or 31a) when the sputtering is performed on the one target 31a (or 31b).

A magnet array 51a is provided on the upper portion of the target electrode 32a in the vicinity of the target electrode 32a. The magnet array 51a serves to enhance the uniformity of erosion of the target 31a. The magnet array 51a is configured to perform a rotational motion or a linear motion (reciprocating motion) by a drive mechanism 52a by arranging an N-pole magnet group and an S-pole magnet group on a base body made of a highly permeable material, for example, iron (Fe).

Further, the stage 6 for horizontally placing the wafer W thereon is provided at a position facing the targets 31a and 31b inside the vacuum container 2. The stage 6 is connected to a drive mechanism 61 arranged below the vacuum container 2 via a shaft member 6a. The drive mechanism 61 has a function of rotating the stage 6. Further, the drive mechanism 61 has a function of raising and lowering the stage 6 between a delivery position at which the wafer W is delivered between the vacuum transfer device 121 and the stage 6 via lift pins 63 and a processing position at the time of spattering.

The shaft member 6a is connected to the drive mechanism 61 through the bottom of the vacuum container 2. A seal portion 62 for keeping the interior of the vacuum container 2 airtight is provided at a position where the shaft member 6a penetrates the vacuum container 2.

Three lift pins 63 are provided so as to support the wafer W from the lower surface of the wafer W at three points, and are lifted up and down by an elevating part 64 via a support member 65.

Further, a heating mechanism (not shown) is provided in the stage 6 so that the wafer W can be heated at the time of sputtering.

Further, a circular shutter 7 having a size larger than that of the wafer W is provided inside the vacuum container 2. The shutter 7 is configured to be swingable in the horizontal direction around a support pillar 7a provided at the end thereof. The shutter 7 swings between a shielding position at which the wafer W placed on the stage 6 is covered and a retracted position (see a two-dot chain line) that is retracted from the shielding position (the position at which the wafer W is covered). The support pillar 7a penetrates the bottom of the vacuum container 2 and is rotatably supported by a rotation support 72 via a rotation driver 71.

The support pillar 7a is connected to the rotation driver 71 through the bottom of the vacuum container 2. A seal portion 73 for keeping the interior of the vacuum container 2 airtight is provided at a position where the support pillar 7a penetrates the vacuum container 2.

Further, the shutter 7 has a function of supplying an oxygen ($O_2$) gas to the wafer W in addition to the shielding function. The function of supplying the oxygen gas will be described later with reference to FIGS. 6 and 7.

Further, a heater (not shown) for heating the shutter 7 is provided inside the shutter 7. A power supply 72a supplies electric power to the heater inside the shutter 7 via a slip ring (not shown) provided on the rotation support 72. As a result, the shutter 7 can supply the pre-heated oxygen gas to the wafer W.

Further, an Ar gas supply path 28 for supplying an inert gas, for example, an Ar gas, which is a gas for generating plasma, into the vacuum container 2, is provided on the upper side wall of the vacuum container 2. The Ar gas supply path 28 is connected to an Ar gas source 26 via a gas control device group 27 such as a valve and a flow meter.

The controller 200 controls the supply operation of the electric power performed by the power supplies 34a and 34b, the supply operation of the Ar gas performed by the Ar gas source 26, the raising/lowering operation and the rotation operation of the stage 6 performed by the drive mechanism 61, the rotation operation and the oxygen gas supply operation of the shutter 7, the rotation operation of the magnet arrays 51a and 51b, the rotation operation of the shutter 41, the exhaust operation of the interior of the vacuum container 2 performed by the vacuum exhaust device 22, and other operations related to the process chamber 114. Further, the controller 200 reads a program incorporating a group of instructions for the control necessary for forming the metal oxide film on the wafer W, from an external storage medium such as a hard disk, a tape storage, a compact disc, a magneto-optical disc, or a memory card, and controls the entire vacuum processing apparatus.

Figure 4:
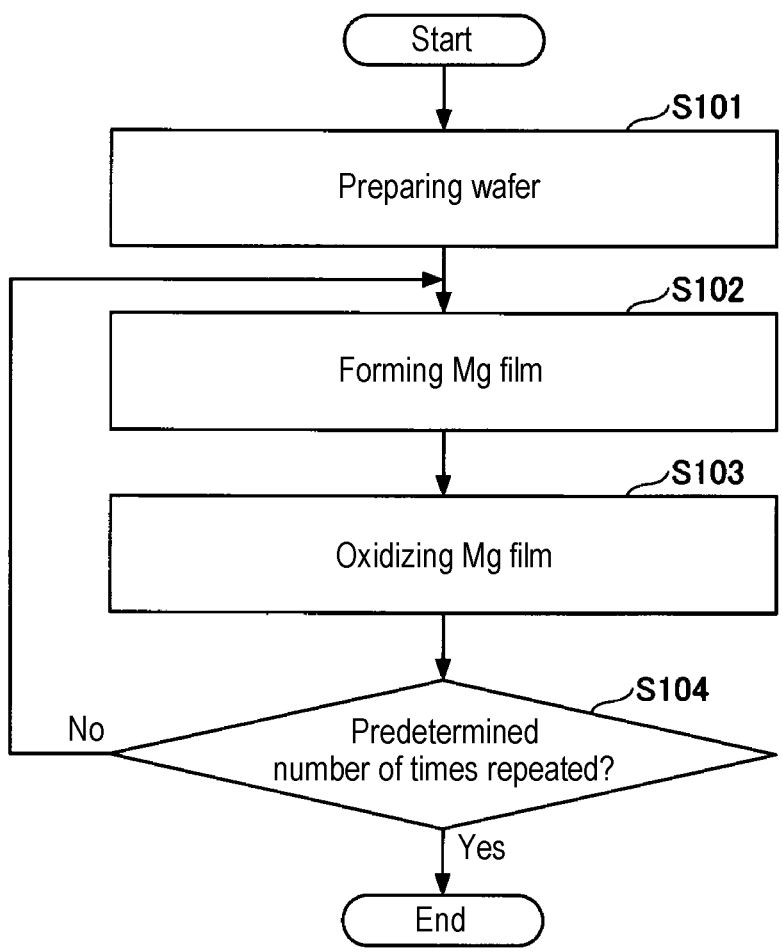
FIG. 4 is a flowchart for explaining a film forming process performed in the process chamber according to an embodiment.
Figure 5A:
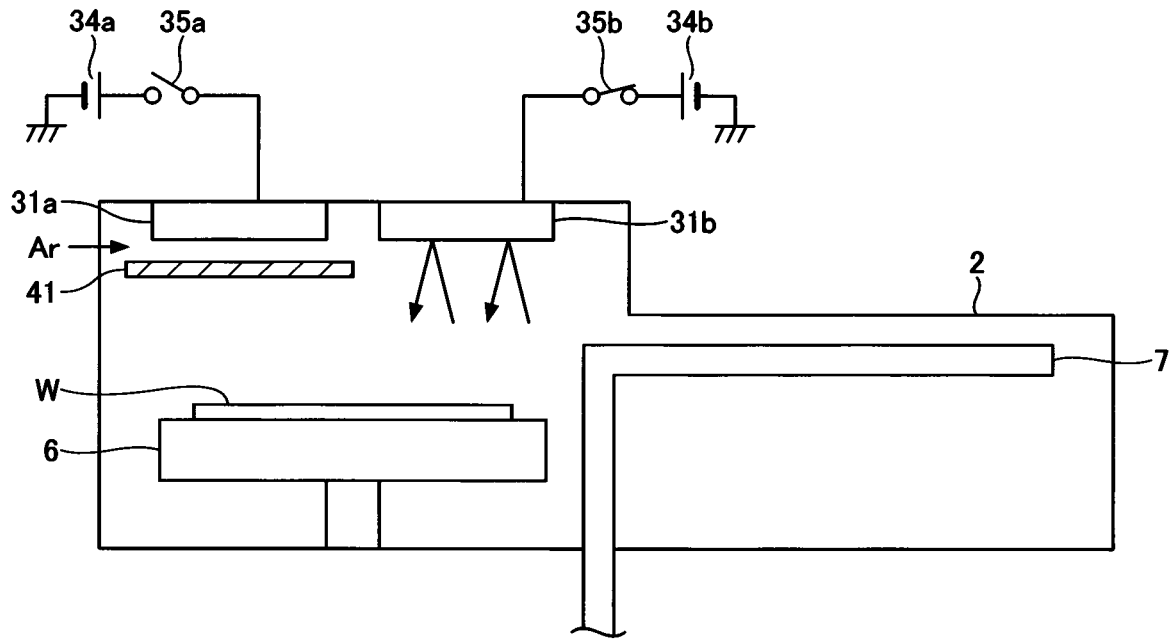
FIGS. 5A and 5B are schematic views for explaining a state of the process chamber according to the embodiment.
Figure 5B:
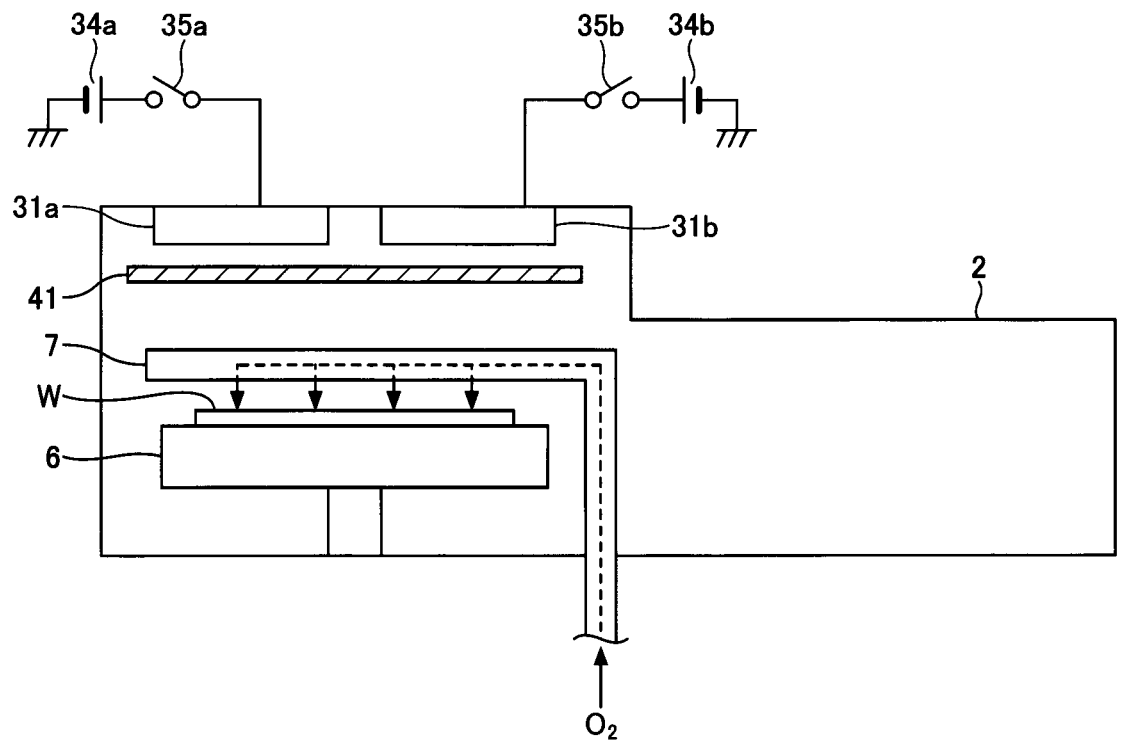

FIG. 4 is a flowchart for explaining a film forming process performed in the process chamber 114 according to the present embodiment. FIGS. 5A and 5B are schematic views for explaining a state of the process chamber 114 according to the present embodiment. Here, as an example of the metal oxide film, a MgO film is formed on the wafer W.

In step S101, the wafer W is prepared. Here, the wafer W on which up to the second magnetic layer 306 processed in the process chamber 113 (see FIG. 1) is formed, is placed on the stage 6 of the process chamber 114.

In step S102, a Mg film forming process is performed. As shown in FIG. 5A, the controller 200 controls the rotation driver 44 to position the opening 42 of the shutter 41 in a region facing the target 31b. Further, the controller 200 controls the rotation driver 71 to move the shutter 7 to the retracted position. Then, the controller 200 controls the gas control device group 27 to supply an Ar gas from the Ar gas supply path 28 into the vacuum container 2. Further, the controller 200 controls the switch 35b to apply a voltage to the target electrode 32b. Further, the controller 200 controls the drive mechanism 52b to rotate the magnet array 51b. Further, the controller 200 controls the drive mechanism 61 to rotate the stage 6. As a result, the Ar gas is plasmarized, the target 31b is sputtered, and Mg particles adhere to the wafer W to form the Mg film.

Upon completion of the Mg film forming process, the controller 200 controls the gas control device group 27 to stop the supply of the Ar gas. Further, the controller 200 controls the switch 35b to stop the supply of the voltage to the target electrode 32b. Further, the controller 200 controls the drive mechanism 52b to stop the rotation of the magnet array 51b.

In step S103, a Mg film oxidizing process is performed. As shown in FIG. 5B, the controller 200 controls the rotation driver 44 to position the opening 42 of the shutter 41 in a region deviating from the targets 31a and 31b, in other words, position the opening 42 of the shutter 41 so that the shutter 42 covers the targets 31a and 31b. The controller 200 controls the rotation driver 71 to move the shutter 7 to the shielding position. As a result, a processing space is formed between the shutter 7 and the stage 6. Further, the controller 200 controls the drive mechanism 61 to rotate the stage 6. Then, the controller 200 controls an oxygen gas control device group (oxygen gas control device groups 82 and 84 to be described later with reference to FIG. 6) to supply an oxygen gas into the processing space. As a result, the Mg film formed on the wafer W is oxidized to form a MgO film. Upon completion of the Mg film oxidizing process, the controller 200 controls the oxygen gas control device group to stop the supply of the gas.

In step S104, the controller 200 determines whether or not the Mg film forming process (in step S102) and the Mg film oxidizing process (in step S103) have been repeated a predetermined number of times. When it is determined that the processes have not been repeated the predetermined number of times ("No" in S104), the controller 200 returns the process to step S102. When it is determined that the processes have been repeated the predetermined number of times ("Yes" in S104), the controller 200 controls the drive mechanism 61 to stop the rotation of the stage 6 to end the sequence of processes. Thereafter, the wafer W is transferred to the process chamber 115 (see FIG. 1).

The film forming process by the process chamber 114 is not limited to that shown in FIGS. 5A and 5B. The film forming process by the process chamber 114 may include spattering the target 31a made of a gettering member and absorbing oxygen and moisture inside the vacuum container 2.

Figure 6:
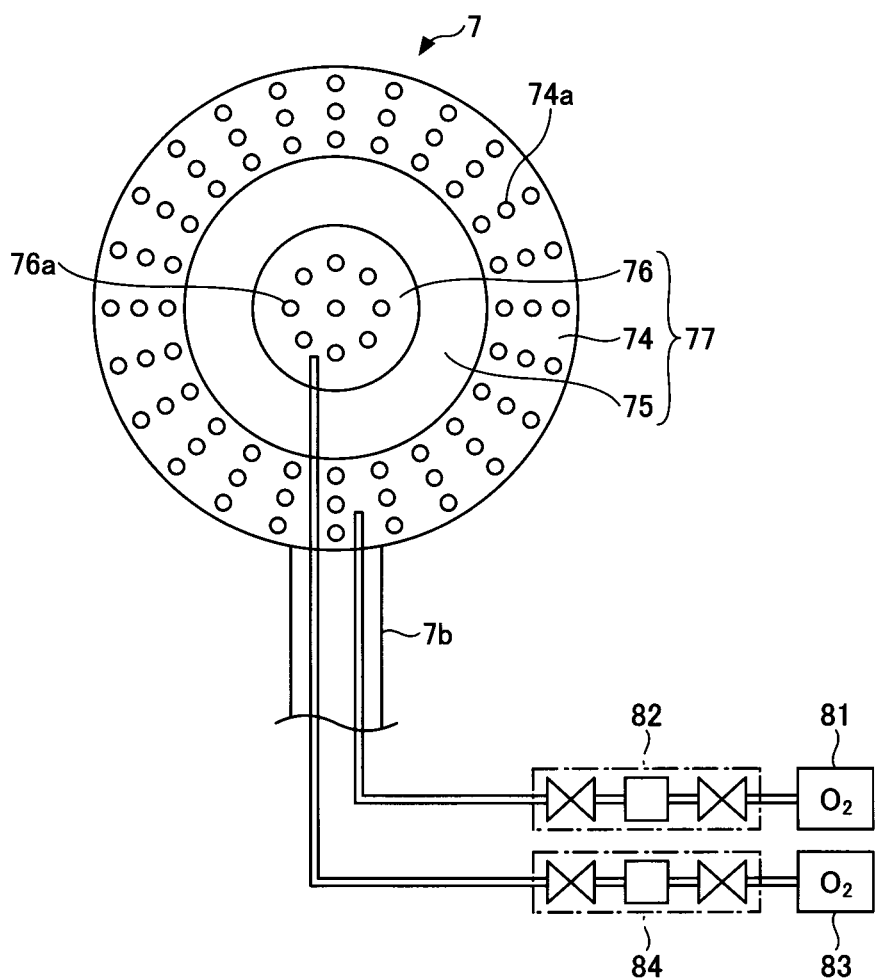
FIG. 6 is a schematic view of a shutter provided in the process chamber according to the embodiment as viewed from below.
Figure 7:
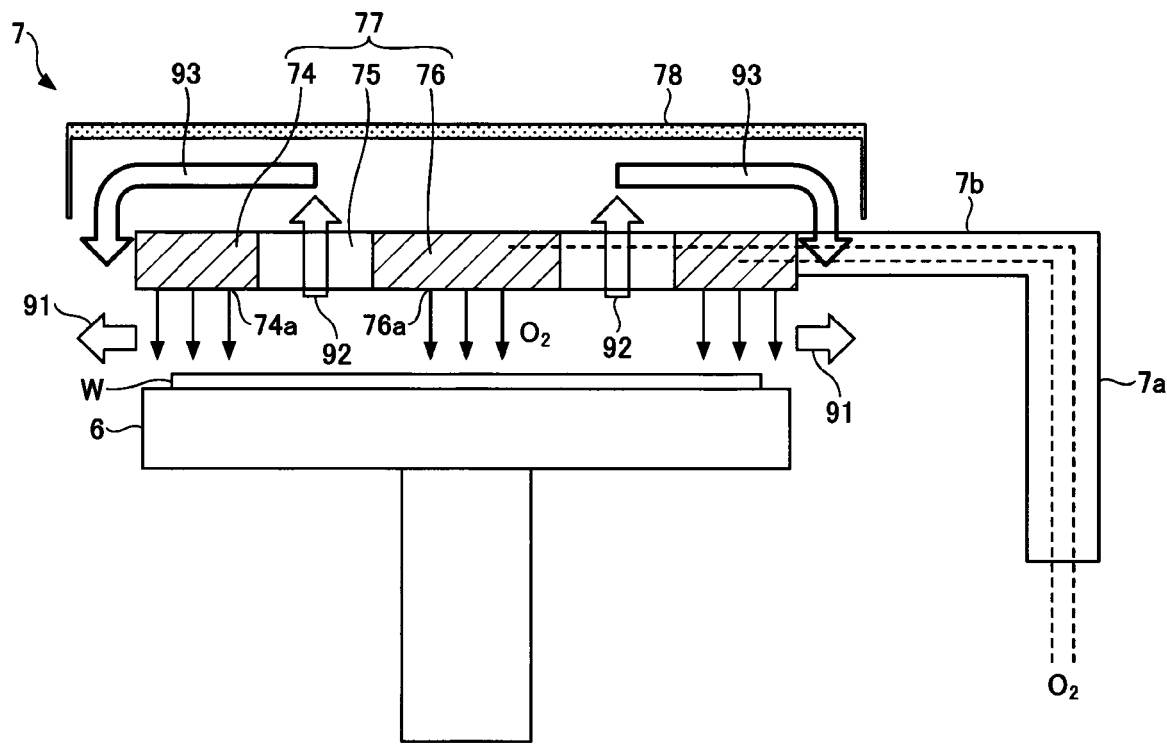
FIG. 7 is a view for explaining a flow of an oxygen gas in the process chamber according to the embodiment.

FIG. 6 is a schematic view of the shutter 7 provided in the process chamber 114 according to the present embodiment as viewed from below. FIG. 7 is a view for explaining a flow of the oxygen gas in the process chamber 114 according to the present embodiment.

The shutter 7 includes a gas supply member 77 and a shielding member 78. The shutter 7 is supported by the support pillar 7a via a support member 7b.

As shown in FIG. 7, when the shutter 7 is arranged at the shielding position, a processing space into which the oxygen gas is supplied is formed between the gas supply member 77 and the stage 6.

The gas supply member 77 includes a first gas supplier 74, a gas exhauster 75, and a second gas supplier 76, and is formed in a circular shape in a plan view.

The first gas supplier 74 is formed in an annular shape in a plan view, includes a plurality of gas supply ports 74a, and supplies the oxygen gas into the processing space from the outer peripheral portion of the shutter 7. The gas supply ports 74a are connected to an oxygen gas source 81 via the oxygen gas control device group 82 such as a valve and a flow meter.

The second gas supplier 76 is formed in a circular shape closer to the center side than the first gas supplier 74 in a plan view, includes a plurality of gas supply ports 76a, and supplies the oxygen gas into the processing space from the central portion of the shutter 7. The gas supply ports 76a are connected to an oxygen gas source 83 via the oxygen gas control device group 84 such as a valve and a flow meter.

The gas exhauster 75 is arranged closer to the center side than the first gas supplier 74 in a plan view. Further, the gas exhauster 75 is arranged in an annular shape between the first gas supplier 74 and the second gas supplier 76 in a plan view. The gas exhaust portion 75 is formed so as to penetrate the gas supply member 77 in a plate thickness direction (vertical direction). As a result, the gas exhauster 75 exhausts the oxygen gas from the processing space on the center side of the shutter 7.

The shielding member 78 is formed so as to cover the gas supply member 77. Further, a flow path through which a gas flows is formed between the upper surface of the gas supply member 77 and the lower surface of the shielding member 78.

Figure 8:
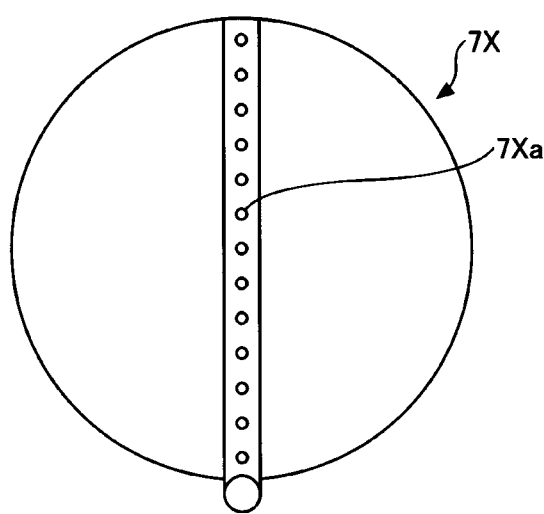
FIG. 8 is a schematic view of a shutter provided in a process chamber according to a reference example as viewed from below.
Figure 9:
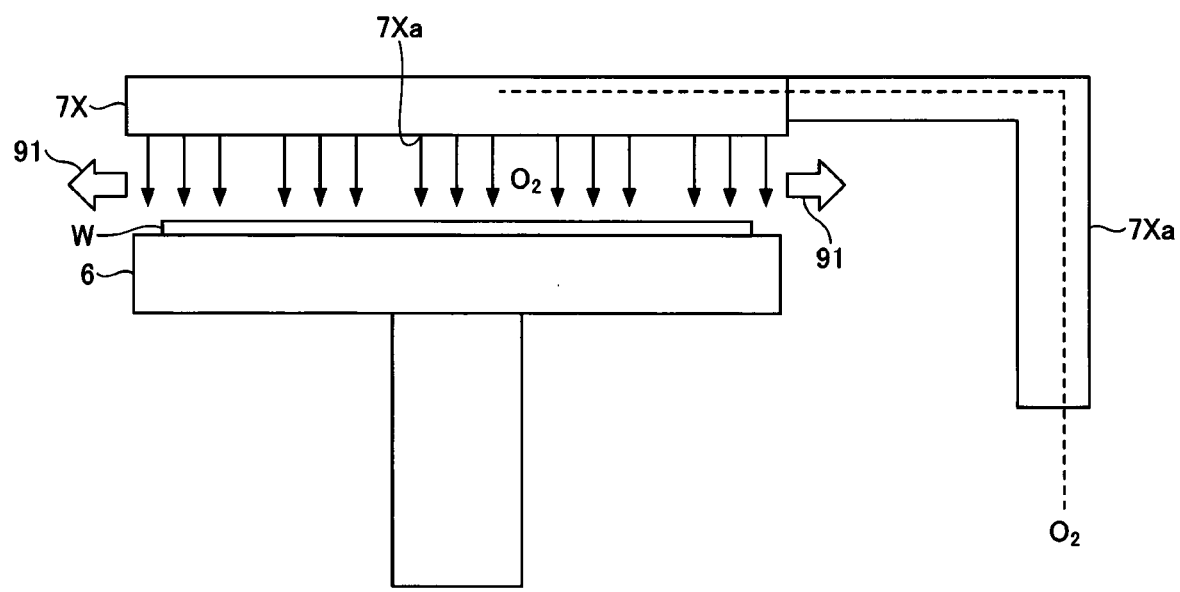
FIG. 9 is a view for explaining a flow of an oxygen gas in the process chamber according to the reference example.

Here, a shutter 7X provided in a process chamber according to a reference example will be described with reference to FIGS. 8 and 9. FIG. 8 is a schematic view of the shutter 7X provided in the process chamber according to the reference example as viewed from below. FIG. 9 is a view for explaining a flow of the oxygen gas in the process chamber according to the reference example. The process chamber according to the reference example is different in the structure of the shutter 7X from the process chamber 114 according to the present embodiment. Other structures are similar, and a duplicate description thereof will be omitted.

The shutter 7X according to the reference example is formed with a plurality of gas supply ports 7Xa in a pipe attached to the lower surface side of the shutter 7X, and supplies the oxygen gas into the processing space from the gas supply ports 7Xa.

Here, as shown in FIG. 9, an outer peripheral side of the processing space formed by the shutter 7X and the stage 6 is open. Therefore, the oxygen gas (see a black arrow) supplied into the processing space from the gas supply ports 7Xa oxidizes a Mg film on the surface of the wafer W, and is exhausted from the outer peripheral side of the processing space, as shown in a gas flow 91 (see a white arrow).

Therefore, a pressure in the vicinity of the center of the wafer W is higher than a pressure in the vicinity of the outer periphery of the wafer W. Further, an oxidizing process in the vicinity of the center of the wafer W is promoted as compared with that in the vicinity of the outer periphery of the wafer W, which causes non-uniformity of the oxidizing process in the radial direction of the wafer W. In addition, the resistance area product (RA) of the MTJ element becomes non-uniform in the radial direction of the wafer W.

In contrast, as shown in FIG. 7, the outer peripheral side of the processing space formed by the shutter 7 and the stage 6 is open and the gas exhauster 75 is formed closer to the center side than the first gas supplier 74. Therefore, the oxygen gas (see the black arrow) supplied into the processing space from the gas supply ports 74a and 76a oxidizes the Mg film on the surface of the wafer W and is exhausted from the outer peripheral side of the processing space, as shown in the gas flow 91 (see the white arrow). Further, as shown in gas flows 92 and 93 (see white arrows), the oxygen gas is also exhausted from the center side of the processing space.

As a result, it is possible to reduce a difference in pressure between the vicinity of the center of the wafer W and the vicinity of the outer periphery of the wafer W. Further, it is possible to reduce the non-uniformity of the oxidizing process in the radial direction of the wafer W. Further, it is possible to reduce the non-uniformity of the resistance area product (RA) of the MTJ element in the radial direction of the wafer W.

Further, it is possible to independently control a flow rate of the oxygen gas supplied from the first gas supplier 74 and a flow rate of the oxygen gas supplied from the second gas supplier 76. As a result, it is possible to control the pressure difference between the vicinity of the center of the wafer W and the vicinity of the outer periphery of the wafer W and control the oxidizing process in the radial direction of the wafer W. Further, it is possible to control the resistance area product (RA) of the MTJ element in the radial direction of the wafer W.

Figure 10A:
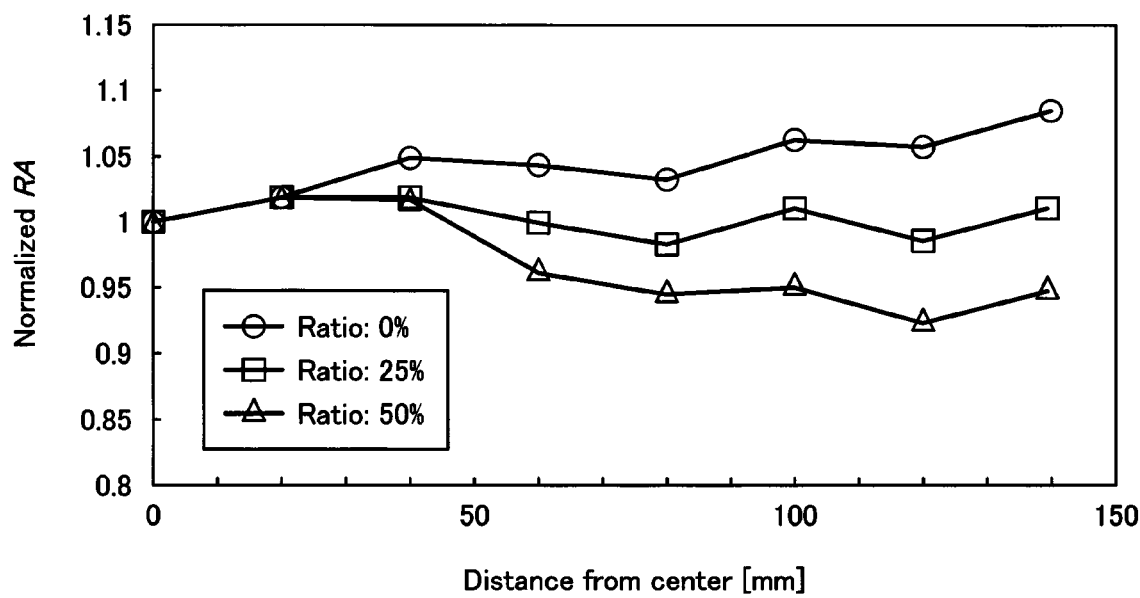
FIGS. 10A and 10B are examples of a graph showing a distribution of a resistance area product in a radial direction of a wafer.
Figure 10B:
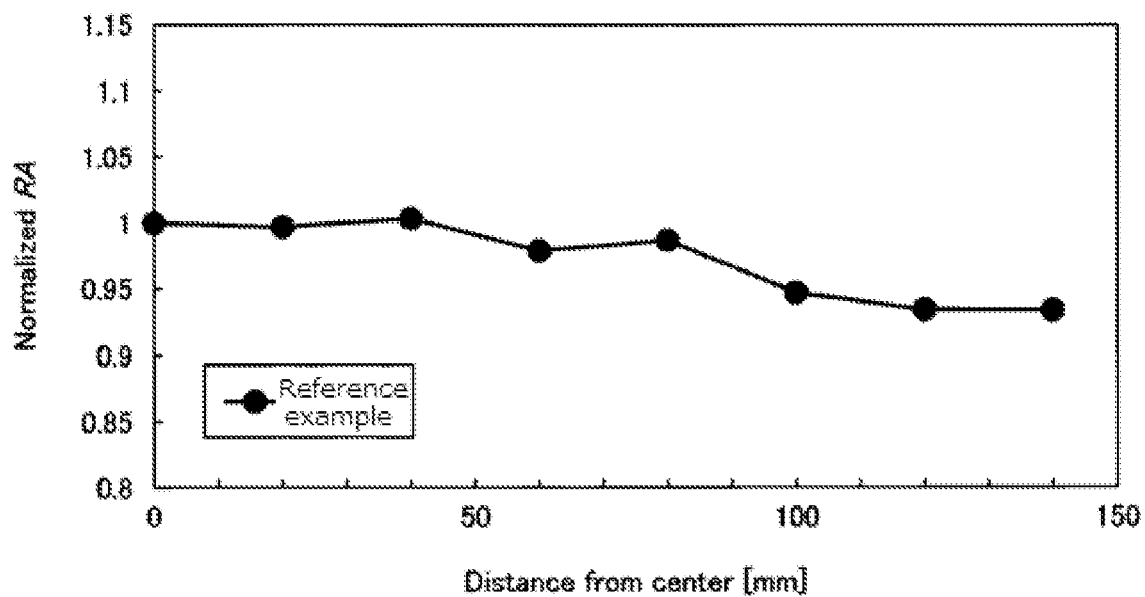

FIGS. 10A and 10B are examples of a graph showing the distribution of the resistance area product (RA) in the radial direction of the wafer W. The horizontal axis represents a radial distance from the center of the wafer W. The vertical axis represents the resistance area product (RA) normalized at the center (0 mm) of the wafer W. FIG. 10A shows the result of the film forming process of the MgO film using the shutter 7 according to the present embodiment. FIG. 10B shows the result of the film forming process of the MgO film using the shutter 7X according to the reference example. Further, FIG. 10A shows the results when a ratio of the flow rate of the second gas supplier 76 to the flow rate of the first gas supplier 74 is 0%, 25%, and 50%, respectively.

In the reference example shown in FIG. 10B, the RA distribution is relatively high on the center side of the wafer W. In the result shown in FIG. 10B, the RA distribution (1σ, %) was 3.1.

In contrast, in the present embodiment shown in FIG. 10A, when the flow rate ratio is 25%, the variation in the RA distribution was reduced. In the results shown in FIG. 10A, the RA distribution (1σ, %) at the flow rate ratio of 25% was 1.4. That is, it is possible to reduce the non-uniformity of the resistance area product (RA) of the MTJ element as compared with the reference example (see FIG. 10B).

Further, in the present embodiment shown in FIG. 10A, when the flow rate ratio is 0%, it is possible to form the RA distribution in which RA in the outer peripheral side of the wafer W is relatively high. Further, when the flow rate ratio is 50%, it is possible to form the RA distribution in which RA in the center side of the wafer W is relatively high. That is, it is possible to control the shape of the RA distribution of the MTJ element by controlling the flow rate of the oxygen gas supplied from the first gas supplier 74 and the flow rate of the oxygen gas supplied from the second gas supplier 76.

Although the substrate processing system and the vacuum processing apparatus have been described above with the above-described embodiments, the substrate processing system and the vacuum processing apparatus according to the present disclosure are not limited to the above-described embodiments, and various modifications and improvements can be made within the scope of the present disclosure. The matters described in the aforementioned embodiments may have other configurations to the extent that they are not contradictory.

The vacuum processing apparatus (the process chamber 114) has been described as forming the MgO film on the wafer W, but the vacuum processing apparatus is not limited thereto. The vacuum processing apparatus (the process chamber 114) may be configured to form a metal oxide film on the wafer W. Further, the gas supplied from the shutter 7 to the wafer W has been described as being the $O_2$ gas, but the gas is not limited thereto, and may be other oxidizing gases.

According to the present disclosure in some embodiments, it is possible to provide a vacuum processing apparatus capable of adjusting a pressure distribution of an oxygen-containing gas supplied to a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A vacuum processing apparatus comprising:
a stage on which a substrate is placed; and
a shutter configured to be able to move between a shielding position at which the stage is covered and a retracted position that is retracted from the shielding position,
wherein the shutter arranged at the shielding position forms a processing space between the shutter and the stage,
wherein the shutter includes:
a support member;
a support pillar provided at an end of the support member;
a gas supplier provided in the support member and configured to supply a gas into the processing space; and
a gas exhauster provided closer to a center side of the processing space than the gas supplier and configured to exhaust the gas from the processing space,
wherein the gas supplier includes:
a first gas supplier configured to supply a first gas into the processing space from an outer peripheral portion of the shutter, the first gas supplier being formed in an annular shape in a plan view; and
a second gas supplier configured to supply a second gas into the processing space from a central portion of the shutter, the second gas supplier being formed in an annular shape in the plan view,
wherein the gas exhauster is arranged in an annular shape between the first gas supplier and the second gas supplier in the plan view, and
wherein the gas exhauster is formed so as to penetrate the gas supplier in a thickness direction of the gas supplier.

2. The vacuum processing apparatus of claim 1, further comprising:
a first flow rate controller configured to control a first flow rate of the first gas supplied to the first gas supplier; and
a second flow rate controller configured to control a second flow rate of the second gas supplied to the second gas supplier.

3. The vacuum processing apparatus of claim 2, further comprising: a shielding member configured to cover the first gas supplier, the second gas supplier, and the gas exhauster.

4. The vacuum processing apparatus of claim 1, further comprising: a shielding member configured to cover the first gas supplier, the second gas supplier, and the gas exhauster.

* * * * *